United States Patent
Jin et al.

(10) Patent No.: US 8,169,413 B2
(45) Date of Patent: May 1, 2012

(54) METHOD FOR OPERATING TOUCH INPUT DEVICE AND PORTABLE TERMINAL USING THE SAME

(75) Inventors: Chung Suk Jin, Daegu (KR); Hae Jun An, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 510 days.

(21) Appl. No.: 12/401,372

(22) Filed: Mar. 10, 2009

(65) Prior Publication Data

US 2009/0260898 A1  Oct. 22, 2009

(30) Foreign Application Priority Data

Apr. 22, 2008 (KR) .................. 10-2008-0037036

(51) Int. Cl.
*G09G 5/00* (2006.01)
*G06F 3/044* (2006.01)
(52) U.S. Cl. ............. 345/173; 345/178; 178/18.06
(58) Field of Classification Search .......... 345/173, 345/174, 178; 178/18.06
See application file for complete search history.

(56) References Cited

U.S. PATENT DOCUMENTS

| 6,885,365 | B1 * | 4/2005 | Kang | 345/173 |
| 7,639,238 | B2 * | 12/2009 | Hauck | 345/173 |
| 7,692,638 | B2 * | 4/2010 | Land et al. | 345/173 |
| 7,920,134 | B2 * | 4/2011 | Krah | 345/178 |
| 2008/0078590 | A1 * | 4/2008 | Sequine | 178/18.06 |

FOREIGN PATENT DOCUMENTS

| JP | 2007-157371 A | 6/2007 |
| KR | 10-0759339 B1 | 9/2007 |

\* cited by examiner

*Primary Examiner* — Quan-Zhen Wang
*Assistant Examiner* — Michael J Eurice
(74) *Attorney, Agent, or Firm* — Jefferson IP Law, LLP

(57) ABSTRACT

A method for operating a touch input device and a portable terminal using the touch input device may prevent a malfunction of the touch input device due to an abrupt change of external temperature. The method for operating a touch input device measures a temperature, calculates a temperature difference value between temperatures measured at a current time point and a previous time point, and compensates a recognition threshold value used for detecting a touch event with a predefined compensation value based on the temperature difference value.

20 Claims, 4 Drawing Sheets

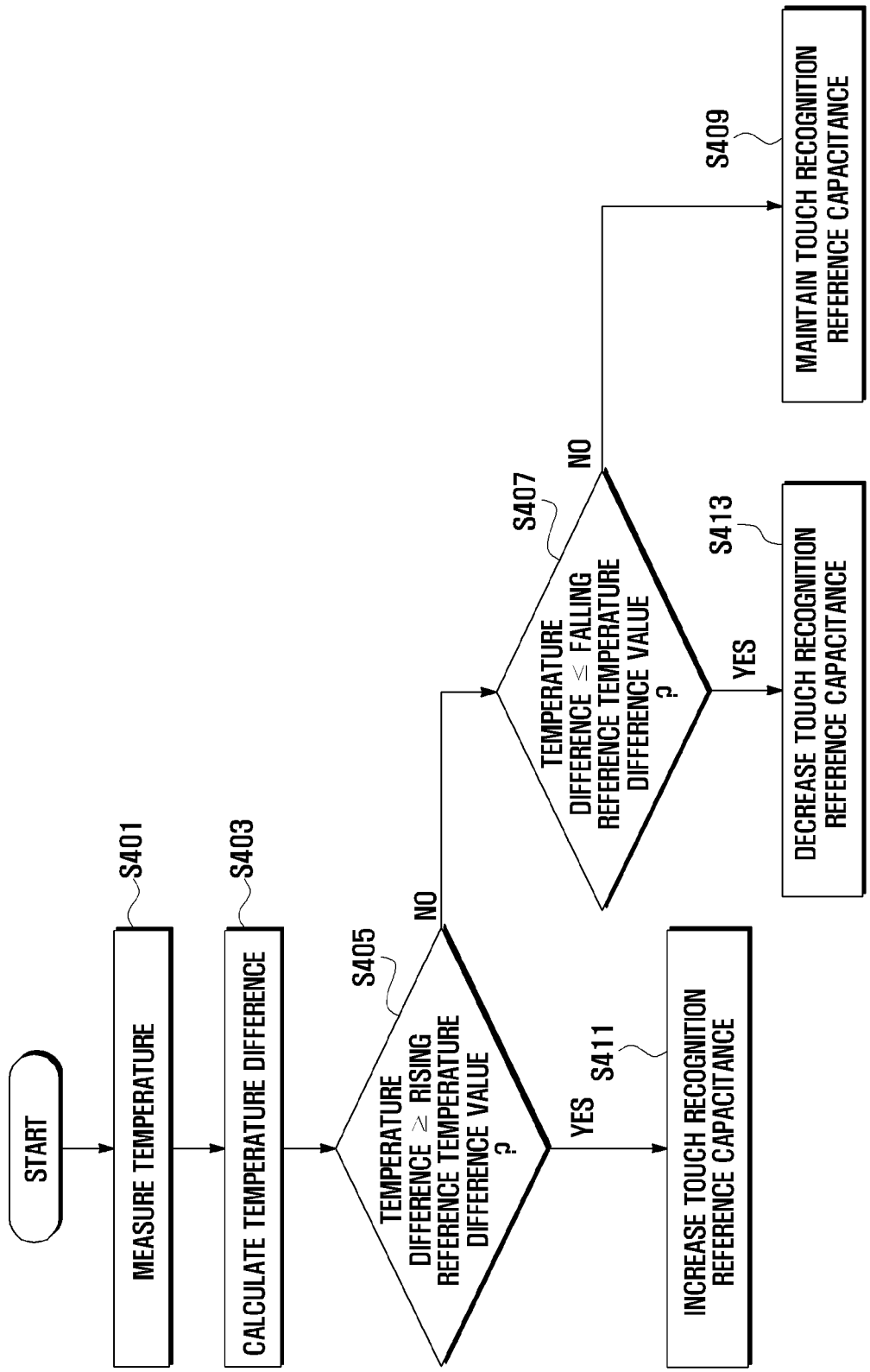

METHOD FOR OPERATING TOUCH INPUT DEVICE AND PORTABLE TERMINAL USING THE SAME

PRIORITY

This application claims the benefit under 35 U.S.C. §119(a) of a Korean patent application filed in the Korean Intellectual Property Office on Apr. 22, 2008 and assigned Serial No. 10-2008-0037036, the entire disclosure of which is hereby incorporated by reference.

BACKGROUND OF THE INVENTION

1. Field of the Invention

The present invention relates to a touch input device. More particularly, the present invention relates to a method for operating a touch input device and a portable terminal using the same that may prevent a malfunction of the touch input device due to an abrupt change of external temperature.

2. Description of the Related Art

In line with a trend of convergence of digital devices, portable terminals are becoming multi-functional devices that integrate diverse functionalities. For example, a recent portable terminal integrates multimedia features such as Audio On Demand (AOD), Video On Demand (VOD), video conferencing, and gaming functions. As the integrated functions are diversified and increased in number, a convenient user interface for enabling a user to control the functions efficiently is becoming increasingly desired, and a touch input device is considered as a promising input device alternative. Since the touch input device enables a user to manipulate data on a screen only with a finger or a stylus, people of all ages and both sexes can use the touch input device. Accordingly, the touch input device is being used in a wide range of applications including banking systems, point-of-sale systems, public information kiosks, tourist information kiosks, and traffic information kiosks. The touch input device inputs a physical change on its screen panel and transmits the physical change to a touch detector. In a capacitive system, a layer that stores electrical charge is placed on a screen panel. When a user touches the screen panel with his or her finger, some of the charge is transferred to the screen panel so the charge on the capacitive layer increases. When the increase of the charge is greater than a threshold value, a touch event has occurred.

Meanwhile, the physical characteristics of the touch input device may change depending on an external temperature. That is, when the external temperature changes abruptly, the variation of the physical characteristic causes a malfunction of the touch input device such that a touch event has occurred. Accordingly, there has been a need to effectively prevent the malfunction of the touch input device.

SUMMARY OF THE INVENTION

An aspect of the present invention is to address at least the above-mentioned problems and/or disadvantages and to provide at least the advantages described below. Accordingly, an aspect of the present invention is to provide a method for operating a touch input device and a portable terminal using the method that are capable of preventing the touch input device from reading its physical change caused by a change of external temperature as a touch event.

In addition, another aspect of the present invention is to provide a method for operating a touch input device and a portable terminal using the method that are capable of preventing the touch input device from malfunctioning due to the change of external temperature by compensating a touch recognition threshold value depending on the external temperature measured by a temperature sensor.

In accordance with an aspect of the present invention, a method for operating a touch input device is provided. The method includes measuring a temperature, calculating a temperature difference value between temperatures measured at a current time point and a previous time point, and compensating a recognition threshold value used for detecting a touch event using a predefined compensation value based on the temperature difference value.

In accordance with another aspect of the present invention, a portable terminal is provided. The terminal includes a touch input device for inputting a change of a physical characteristic associated with a touch event, a temperature sensor for measuring a temperature, a touch detector for detecting the touch event, a temperature comparator for calculating a temperature difference value between temperatures measured by the temperature sensor at a current time point and a previous time point, and a compensation algorithm executor for compensating a recognition threshold value used for detecting the touch event using a predefined compensation value based on the temperature difference value.

In accordance with another aspect of the present invention, a portable terminal is provided. The terminal includes a touch input device for inputting a change of a physical characteristic associated with a touch event, a temperature sensor for measuring a temperature, a touch detector for detecting the touch event, a temperature comparator for calculating a temperature difference value between temperatures measured by the temperature sensor at a current time point and a previous time point, and a compensation algorithm executor for increasing a recognition threshold value by adding a compensation value to the recognition threshold value, when the temperature difference value is equal to or greater than a rising reference temperature difference value, and for decreasing the recognition threshold value by subtracting the compensation value from the recognition threshold value, when the temperature difference value is equal to or less than a falling reference temperature difference value.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which:

FIG. 4 is a flowchart illustrating a method for operating a touch input device according to an exemplary embodiment of the present invention.

Throughout the drawings, it should be noted that like reference numbers are used to depict the same or similar elements, features, and structures.

DETAILED DESCRIPTION OF EXEMPLARY EMBODIMENTS

Figure 1:
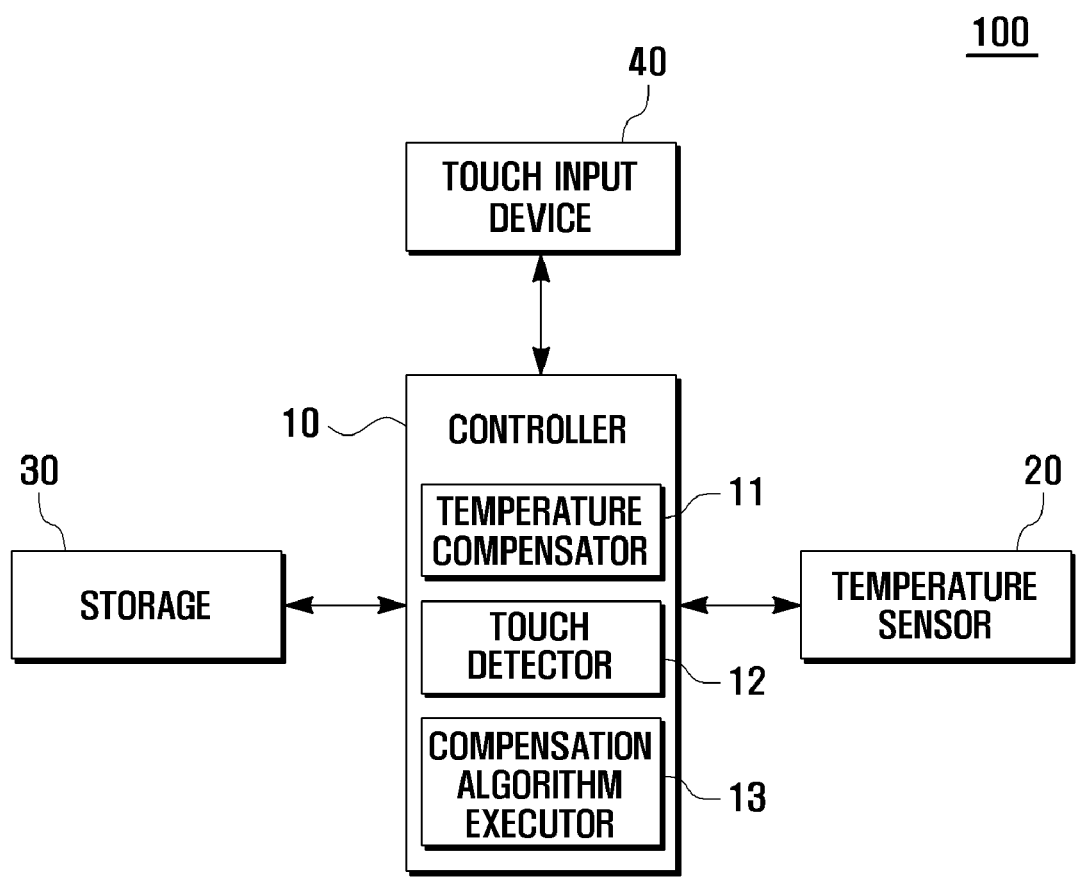
FIG. 1 is a block diagram illustrating a configuration of a portable device according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although the method for operating a touch input device is explained in association with the mobile phone as a portable terminal in the following description, the present invention is not limited thereto. For example, the portable terminal can be a Personal Digital Assistant (PDA), a Smartphone, a cellular phone (such as a Code Division Multiple Access (CDMA) terminal, a Wideband CDMA (WCDMA) terminal, a Global System for Mobile communication (GSM) terminal, and a General Packet Radio Service (GPRS) terminal), a Digital Broadcast receiver, a Portable Multimedia Player (PMP), a laptop, an Automated Teller Machine (ATM), and their equivalent devices that are equipped with a touch input device.

In the following description, the touch input device can be any of a variety of devices including a touch panel, a touch key, and a touchscreen that may input a change of a physical characteristic to a touch detector.

In the following description, the term "recognition threshold value" denotes a reference value for determining whether a touch event has occurred on the touch input device. When the change of a physical characteristic of the touch input device is greater than the recognition threshold value, the touch detector detects a touch event.

In the following description, the term "reference temperature difference value" denotes a reference value for determining whether to execute a compensation algorithm. There can be two reference temperature difference values for a rising reference temperature difference value and a falling reference temperature difference value. The compensation algorithm is activated when the temperature difference that has risen or fallen during a predefined period is greater than the rising or falling reference temperature difference value.

In the following description, the term "compensation value" denotes a value added to or subtracted from the recognition threshold value depending on the change of external temperature. The compensation value can be a positive or a negative value.

FIG. 1 is a block diagram illustrating a configuration of a portable device according to an exemplary embodiment of the present invention.

In this exemplary embodiment, the touch input device operation method is described with an exemplary capacitive touch input device. However, the present invention is not limited thereto. For example, the touch input device operation method can be applied to other types of touch input devices of which physical characteristics change depending on the variation of external temperature.

Referring to FIG. 1, the portable terminal 100 includes a controller 10, a temperature sensor 20, a storage 30, and a touch input device 40.

The touch input device 40 can be implemented with any of a touchscreen, a touch key, and a touch panel that are able to input a change of a physical characteristic associated with a touch event. More particularly, in this exemplary embodiment, the touch input device 40 may be a capacitive touch input device. The capacitive touch input device uses the change of capacitance to recognize a touch event. In more detail, when the capacitance of the touch input device 40 changes by a contact of another object (e.g. human finger) on the touch input device 40, it determines the change and transfers the determined change to a controller 10 via electric circuits such that the controller 10 can calculate a contact point. The touch input device 40 has a characteristic of which capacitance changes according to the variation of temperature. For example, when the external temperature rises, the capacitance of the touch input device 40 increases. Otherwise, when the external temperature falls, the capacitance of the touch input device 40 decreases.

The temperature sensor 20 is a sensor for measuring temperature using devices such as metal wire and semiconductor of which resistance varies according to the temperature. In this exemplary embodiment, a thermistor may be used as the temperature sensor 20. However, the present invention is not limited thereto. For example, the temperature sensor 20 can be implemented with any device that can measure temperature. The thermistor is a temperature sensor of which resistance changes according to the temperature. When a predefined voltage is applied to a circuit of the thermistor connected to a resistor in series, the voltage between the thermistor and the resistor varies according to the change of the temperature since the resistance of the thermistor varies due to the change of the temperature. The varying voltage between the thermistor and the resistor is input to an Analog Digital Convertor (ADC) of the controller 10 such that the controller 10 can determine the temperature based on the output of the ADC.

In order to accurately determine the variation of the external temperature influencing the touch input device 40, it is preferred that the temperature sensor 20 is arranged near the touch input device 40.

The controller 10 controls general operations of the portable terminal 100, signaling among internal elements, and data processing. When a touch event is detected on the touch input device 40, the control unit 10 executes a function corresponding to the touch event. For this purpose, the controller 10 includes a temperature comparator 11, a touch detector 12, and compensation algorithm executor 13.

The temperature comparator 11 determines the external temperature and calculates the variation of the temperature periodically, i.e. the temperature difference value. In more detail, the temperature comparator 11 compares the temperatures measured at two time points and calculates the temperature difference value. At this time, if the temperature difference value is equal to or greater than the rising reference temperature difference value or equal to or less than the falling reference temperature difference value, the temperature comparator 11 informs the compensation algorithm executor 13 of this.

The touch detector 12 detects a touch event and calculates a contact point corresponding to the touch event. That is, the touch detector 12 monitors for change of the capacitance of the touch input device 40 and, if the capacitance increases to be greater than a recognition threshold value, recognizes the occurrence of a touch event and calculates the contact point (or coordinates).

The compensation algorithm executor 13 is provided with a compensation algorithm for compensating the recognition threshold value (for example a recognition threshold capacitance) for detecting a touch event according to capacitance displacement of the touch input device 40. The compensation algorithm is implemented to distinguish the capacitance increase caused by a touch event from the capacitance increase caused by the variation of the external temperature. In order to distinguish the capacitance increase caused by a touch event from the capacitance increase caused by a temperature variation, a characteristic is considered in which the capacitance increase caused by the temperature variation takes in long time in comparison with the capacitance increase caused by the touch event. That is, the compensation algorithm compensates the recognition threshold value when the capacitance of touch input device 40 is changed by the temperature variation. If the recognition threshold value is compensated when the capacitance of touch input device 40 is changed by the touch event, the compensated recognition threshold value may become greater than the capacitance increased by the touch event, resulting in a failure to detect the touch event.

The compensation algorithm executor 13 is configured to enable the compensation depending on the variation of the external temperature. In the case where the external temperature rises or falls abruptly, the compensation algorithm executor 13 adds a compensation value ($\alpha$) to the recognition threshold value.

The storage 30 stores application programs and data associated with the method according to this exemplary embodiment. The storage 30 can be divided into a program region and a data region.

The program region stores an operating system and basic programs for booting up and operating the portable terminal 100 and application programs used for supplementary functions of the portable terminal such as camera function and multimedia playback functions for playing audio and still and motion images. More particularly, in this exemplary embodiment, the program region stores the compensation algorithm for compensating the recognition threshold value.

The data region stores user data generated for using the portable terminal 100, such as phonebook, audio data and video data, metadata, and parameters. More particularly in this exemplary embodiment, the data region stores the temperature measurement period of the temperature sensor 20. The temperature measurement period can be configured by the designer of the portable terminal or the touch input device with a value optimized through experimentation. The data region may also store the recognition threshold value. The recognition threshold value can be compensated periodically. The data region also stores the reference temperature difference value. The reference temperature difference value is referred to determine whether to compensate the recognition threshold value (the recognition threshold capacitance). There can be two reference temperature difference values, a rising reference temperature difference value and a falling reference temperature difference value. For example, the rising reference temperature difference value can be 5 per minute and the falling reference temperature difference value can be −5 per minute. However, the reference temperature difference values are not limited to 5 and −5 but can be modified by the system designer or user with values optimized through experimentation. The rising and falling reference temperature difference values can be set to different values. For example, the rising reference temperature difference value can be set to 10 per minute while the falling reference temperature difference value is set to −5 per minute.

The symbol of the reference temperature difference value is set under the assumption that the previous temperature is subtracted from the current temperature. Accordingly, when the current temperature is subtracted from the previous temperature, the symbol is changed.

The data region stores the compensation value ($\alpha$) for increasing or decreasing the recognition threshold value. The compensation value ($\alpha$) can be a constant value set by the system designer or user, or a variable set in proportion to the reference temperature difference value. The compensation value ($\alpha$) is described in more detail further below.

Although not depicted in the drawing, the portable terminal 100 may further include at least one of a Radio Frequency (RF) module, a camera module, a broadcast reception module, an audio signal processing module with a speaker and microphone, a connection port for data connection with an external digital device, an charging port, a digital audio playback module such as MP3 module, etc. Although it is difficult to enumerate all of elements that can be integrated into the portable terminal 100, any other equivalents or additional modules can be included in the portable terminal 100.

Figure 2A:
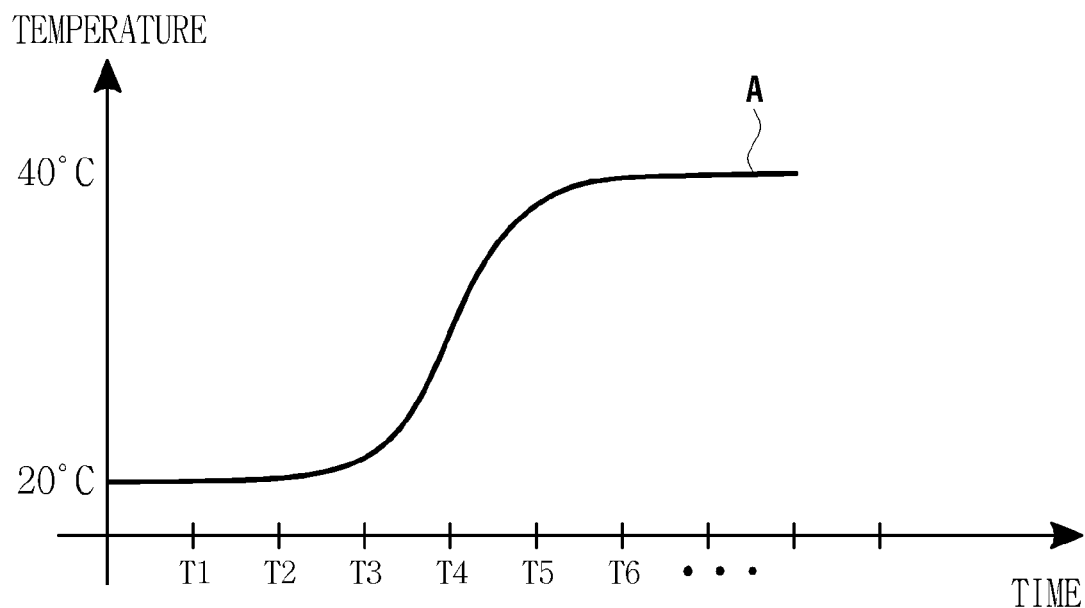
FIG. 2A is a graph illustrating an example of variations of temperature detected by the temperature sensor of FIG. 1.

FIG. 2A is a graph illustrating an example of variations of temperature measured by the temperature sensor of FIG. 1.

Referring to FIG. 2A, an exemplary temperature variation graph is expressed with a horizontal time axis and a vertical temperature axis. As illustrated in the temperature variation graph, the temperature curve A does not change before the time point $T_2$ but increases gradually between the time points $T_2$ and $T_3$ and then increases abruptly between the time points $T_3$ and $T_4$. This might be the case that the user of the portable terminal 100 moves to a hot place between the time points $T_3$ and $T_4$. In this case, as the external temperature increases, the capacitance of the touch input device 40 also increases. The capacitance variation of the touch input device 40 is described in more detail with reference to FIG. 2B.

Figure 2B:
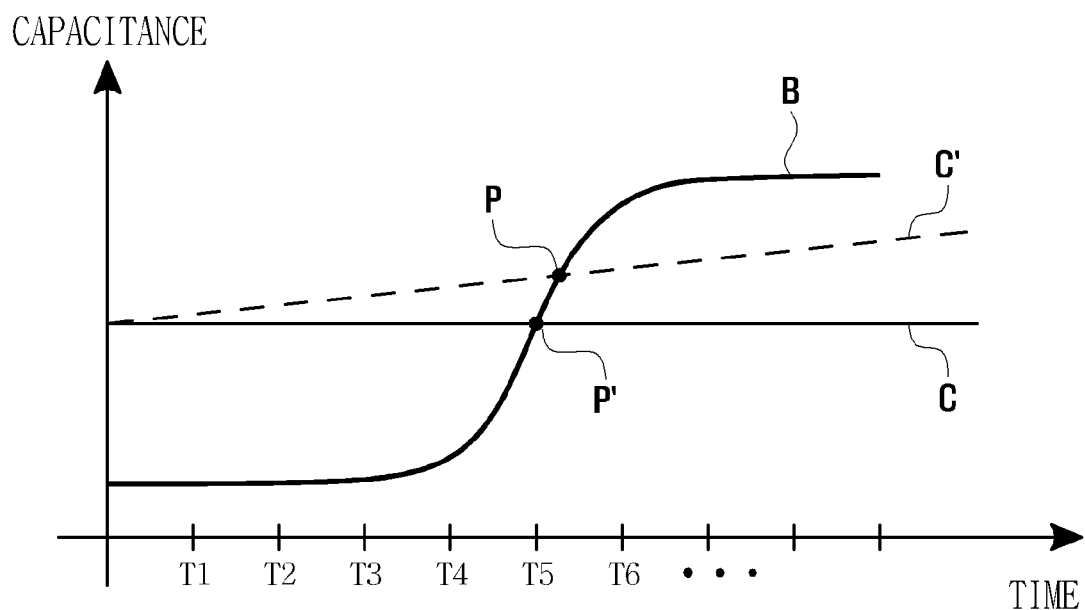
FIG. 2B is a graph illustrating an example of variations of capacitance of the touch input device of FIG. 1 when the external temperature increases as illustrated in FIG. 2A.

FIG. 2B is a graph illustrating an example of variations of capacitance of the touch input device of FIG. 1 when the external temperature increases as illustrated in FIG. 2A. In FIG. 2B, a reference character C represents a curve of the recognition threshold value when the recognition threshold value is fixed, and a reference character C' represents a curve of the recognition threshold value when the recognition threshold value is compensated according to the compensation algorithm based on the variation of the capacitance of prior art.

Referring to FIG. 2B, the graph is expressed with a horizontal time axis and a vertical capacitance axis. The shape of the capacitance curve B is identical with that of the temperature curve A of FIG. 2A but is shifted a little in a time progressing direction. That is, the capacitance of the touch input device 40 increases abruptly between the time points $T_4$ and $T_5$. The curve C and C' meet with the capacitance curve B at P' and P, respectively. This means that, if the recognition threshold value is not compensated, the touch detector 12 detects the touch event at P' or P. that is, the touch detector 12 can misjudge that the capacitance of the touch input device 40 has increased by a touch event. In order to prevent such misjudgment, the recognition threshold value is compensated before the capacitance of touch input device 40 reaches the point P' or the point P.

Figure 2C:
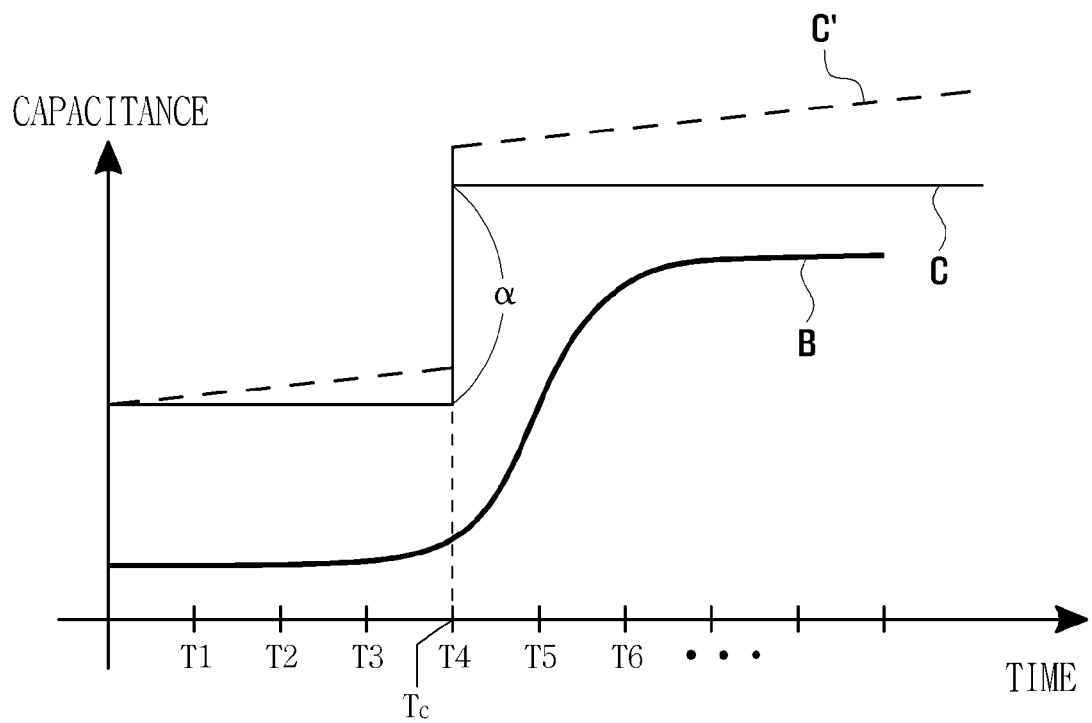
FIG. 2C is a graph illustrating an example of compensation of the touch recognition threshold capacitance B of FIG. 2B.

FIG. 2C is a graph illustrating an example of compensation of the recognition threshold value according to the temperature variation.

Referring to FIG. 2C, the recognition threshold value is compensated by adding the compensation value (α) at time point $T_4$ such that the capacitance curve B does not cross the recognition threshold value curve C or C'. The compensation value (α) can be changed according to the absolute value of the temperature difference between the current temperature and the previous temperature. For example, if the absolute value of the temperature difference is 5, the compensation value (α) is set to 10. In addition, if the absolute value of the temperature difference is 10, the compensation value (α) is set to 20. The compensation value (α) can be set to a value optimized through experimentation.

In the meantime, the compensation time Tc can be determined with reference to the temperature curve A of FIG. 2A. That is, when the temperature difference value between two time points is greater than the rising reference temperature difference value, the compensation algorithm executor 13 determines the compensation time Tc and compensates the recognition threshold value at time Tc. In the case of FIG. 2A, the time $T_4$ at which the temperature increases abruptly becomes the compensation time Tc.

Although the recognition threshold value curve C or C' is compensated once at $T_4$ in an exemplary embodiment of the present invention, the present invention is not limited thereto. For example, the recognition threshold value curve C or C' can be compensated in stepwise manner when the external temperature increases abruptly more than twice in consideration of the reference temperature difference value. If the temperature measurement period is shortened and the compensation value (α) is small, a shape of the recognition threshold value curve C or C' is identical with that of the capacitance curve B but is shifted a little along the capacitance axis.

Until now, an example of compensation of the recognition threshold value has been described in the case where the external temperature increases abruptly. Now, an example of compensation of the recognition threshold value is described in a situation where the external temperature decreases abruptly.

Figure 3:
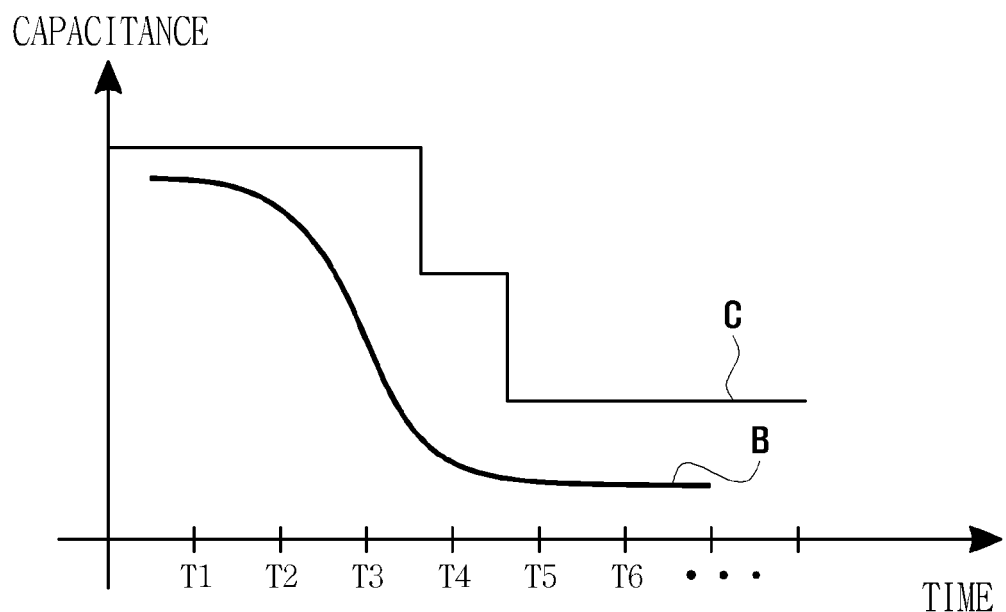
FIG. 3 is a graph illustrating an example of compensation of the touch recognition threshold capacitance when an external temperature drops abruptly.

FIG. 3 is a graph illustrating an example of compensation of the recognition threshold value when an external temperature drops abruptly.

Referring to FIG. 3, as the external temperature drops, the capacitance of the touch input device 40 also decreases. In this case, the recognition threshold value is compensated to decrease between the time points $T_3$ and $T_4$ according to the compensation algorithm. The compensation time can be selected at the time point at which the external temperature decreases abruptly. That is, when the temperature difference value between the current and previous temperature is greater than the falling reference temperature difference value, the compensation algorithm executor 13 compensates the recognition threshold value. In order to reduce the recognition threshold value, the compensation value (α) may be set to a negative value. The compensation value (α) can be set in proportion to the absolute value of the temperature difference. For example, the compensation value (α) can be set to −10 for the temperature difference value of −5 and set to −20 for the temperature difference value of −10. Since an example of compensation using the compensation value (α) has been described with reference to FIGS. 2A to 2C, a detailed description is omitted herein.

FIG. 4 is a flowchart illustrating a method for operating a touch input device according to an exemplary embodiment of the present invention.

Referring to FIGS. 1 to 4, the controller 10 controls to determine the temperature in a predefined temperature measurement period in step S401. In order to determine the temperature, a temperature sensor 20 is used in this exemplary embodiment. More particularly, in this exemplary embodiment, the portable terminal 100 may use a thermistor as the temperature sensor 20. The temperature sensor 20 is may be installed near the touch input device 40 in order to more accurately measure the external temperature.

The temperature measurement period can be determined though an optimization process in consideration of the designer's intention and experimentation results. Next, the temperature comparator 11 of the controller 10 calculates the temperature difference value between the currently measured temperature and the previously measured temperature and sends the temperature difference value to the compensation algorithm executor 13 in step S403.

The compensation algorithm executor 13 determines whether the calculated temperature difference value is equal to or greater than the rising reference temperature difference value in step S405. If the calculated temperature difference value is equal to or greater than the rising reference temperature difference value, then the compensation algorithm executor 13 compensates the recognition threshold value by adding a predefined compensation value (α) in step S411. Here, the compensation value (α) can be a positive (+) value for increasing the recognition threshold value. For example, when the rising reference temperature difference value is set to 5 per minute and the temperature difference value between the temperatures calculated at an interval of 1 minute is 7, the compensation algorithm executor 13 increases the recognition threshold value using the compensation value (α).

If the calculated temperature difference value is less than the rising reference temperature difference value, then the compensation algorithm executor 13 determines whether the calculated temperature difference value is equal to or less than the falling reference temperature difference value in step S407.

If the calculated temperature difference value is greater than the falling reference temperature difference value, then the compensation algorithm executor 13 maintains the recognition threshold value in step S409. At this time, the compensation algorithm executor 13 may execute the compensation algorithm based on the variation of the capacitance of prior art.

Otherwise, if the calculated temperature difference value is equal to or less than the falling reference temperature difference value, then the compensation algorithm executor 13 decreases the recognition threshold value by adding a predefined compensation value (α) in step S413. For example, when the falling reference temperature difference value is set to −5 and the temperature difference value between the currently measured temperature and the previously measured temperature is −7, the compensation algorithm executor 13 decreases the recognition threshold value. The compensation value (α) can be a negative (−) value for decreasing the recognition threshold value.

The compensation value (α) can be determined according to the absolute value of the calculated temperature difference. That is, the compensation value (α) is set to 10 when the absolute value of the temperature difference is 5, and is set to 20 when the absolute value of the temperature difference is 10. The compensation value (α) is positive (+) for the increase of the external temperature and negative (−) for the decrease of the external temperature. That is, the symbol of the compensation value (α) is identical with the symbol of the temperature difference value when the previous temperature is subtracted from the current temperature.

The procedure for steps S401 to S413 is repeated before the portable terminal 100 powers off or the touch input device 40 is deactivated.

As described above, the method for operating the touch input device and portable terminal using the method is advantageous to prevent the touch input device from malfunctioning due to an abrupt temperature change. By addressing the malfunctioning of the touch input device, it is possible to improve the reliability of operations of the portable terminal 100. In addition, the touch input device operation method of exemplary embodiments of the present invention may reduce unnecessary power consumption caused by a malfunctioning of the portable terminal 100 and may improve the utilization reliability.

While the invention has been shown and described with reference to certain exemplary embodiments thereof, it will be understood by those skilled in the art that various changes in form and details may be made therein without departing from the spirit and scope of the present invention, as defined in the appended claims and their equivalents. That is, although a touch input device operation method is described in association with a capacitive touch input device and a portable device using the device, the present invention is not limited thereto. For example, the method of exemplary embodiments of present invention can be applied to any touch input device having physical characteristics that change according to a variation of the external temperature.

What is claimed is:

1. A method for operating a touch input device, the method comprising:
    measuring a temperature;
    calculating a temperature difference value between temperatures measured at a current time point and a previous time point; and
    compensating a recognition threshold value used for detecting a touch event using a predefined compensation value based on the temperature difference value and on a time difference between the current time point and the previous time point.

2. The method of claim 1, wherein the compensating of the recognition threshold value comprises increasing, when the temperature difference value is equal to or greater than a rising reference temperature difference value, the recognition threshold value by adding the compensation value to the recognition threshold value.

3. The method of claim 1, wherein the compensating of the recognition threshold value comprises decreasing, when the temperature difference value is equal to or less than a falling reference temperature difference value, the recognition threshold value by subtracting the compensation value from the recognition threshold value.

4. The method of claim 1, wherein the compensation value is proportional to an absolute value of the temperature difference.

5. The method of claim 1, further comprising detecting the touch event.

6. The method of claim 5, further comprising calculating a contact point corresponding to the touch event.

7. The method of claim 6, wherein the contact point corresponding to the touch event is calculated if a capacitance of the touch input device associated with the touch event is greater than the compensated recognition threshold value.

8. A portable terminal, the terminal comprising:
    a touch input device for inputting a change of a physical characteristic associated with a touch event;
    a temperature sensor for measuring a temperature;
    a touch detector for detecting the touch event;
    a temperature comparator for calculating a temperature difference value between temperatures measured by the temperature sensor at a current time point and a previous time point; and
    a compensation algorithm executor for compensating a recognition threshold value used for detecting the touch event using a predefined compensation value based on the temperature difference value and on a time difference between the current time point and the previous time point.

9. The terminal of claim 8, wherein the temperature sensor comprises a thermistor.

10. The terminal of claim 8, wherein the touch input device comprises one of a touchscreen, a touch panel, and touch key.

11. The terminal of claim 8, wherein the touch input device comprises a capacitive system.

12. The terminal of claim 8, wherein the compensation algorithm executor increases, when the temperature difference value is equal to or greater than a rising reference temperature difference value, the recognition threshold value by adding the compensation value to the recognition threshold value.

13. The terminal of claim 8, wherein the compensation algorithm executor decreases, when the temperature difference value is equal to or less than a falling reference temperature difference value, the recognition threshold value by subtracting the compensation value from the recognition threshold value.

14. The terminal of claim 8, wherein the compensation value is proportional to an absolute value of the temperature difference.

15. The terminal of claim 8, wherein the touch detector calculates a contact point corresponding to the touch event.

16. The terminal of claim 15, wherein the touch detector calculates the contact point corresponding to the touch event if a capacitance of the touch input device associated with the touch event is greater than the compensated recognition threshold value.

17. A portable terminal, the terminal comprising:
    a touch input device for inputting a change of a physical characteristic associated with a touch event;
    a temperature sensor for measuring a temperature;
    a touch detector for detecting the touch event;
    a temperature comparator for calculating a temperature difference value between temperatures measured by the temperature sensor at a current time point and a previous time point; and
    a compensation algorithm executor for increasing a recognition threshold value by adding a compensation value to the recognition threshold value, when the temperature difference value is equal to or greater than a rising reference temperature difference value, and for decreasing the recognition threshold value by subtracting the compensation value from the recognition threshold value, when the temperature difference value is equal to or less than a falling reference temperature difference value, wherein the temperature difference value and the reference temperature difference values are determined with respect to a time difference between the current time point and the previous time point.

18. The terminal of claim 17, wherein the compensation value is proportional to an absolute value of the temperature difference.

19. The terminal of claim 17, wherein the touch detector calculates a contact point corresponding to the touch event.

20. The terminal of claim 19, wherein the touch detector calculates the contact point corresponding to the touch event if a capacitance of the touch input device associated with the touch event is greater than the compensated recognition threshold value.

* * * * *